United States Patent [19]
Ohtsuka et al.

[11] Patent Number: 6,008,450
[45] Date of Patent: *Dec. 28, 1999

[54] SOLAR CELL MODULE HAVING A BACK FACE REINFORCING MEMBER COVERED BY A RESIN AND A PROCESS FOR THE PRODUCTION OF SAID SOLAR CELL MODULE

[75] Inventors: Takashi Ohtsuka, Tsuzuki-gun; Kimitoshi Fukae; Yuji Inoue, both of Nara, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/749,634

[22] Filed: Nov. 15, 1996

[30] Foreign Application Priority Data

Nov. 15, 1995 [JP] Japan .................................. 7-319755

[51] Int. Cl.⁶ .................................................... H01L 25/00
[52] U.S. Cl. ........................ 136/251; 136/259; 52/173.3; 438/66
[58] Field of Search ..................................... 136/251, 259; 52/173.3; 438/66

[56] References Cited

U.S. PATENT DOCUMENTS

| | | | |
|---|---|---|---|
| 5,252,141 | 10/1993 | Inoue et al. | 136/251 |
| 5,589,006 | 12/1996 | Itoyama et al. | 136/248 |
| 5,733,382 | 3/1998 | Hanoka | 136/251 |

*Primary Examiner*—Mark Chapman
*Attorney, Agent, or Firm*—Fitzpatrick, Cella, Harper & Scinto

[57] ABSTRACT

A highly reliable molar cell module comprising a back face reinforcing metallic member, a photovoltaic element, a filler for encapsulating said photovoltaic element, and a surface protective film having a weatherability, wherein the end faces of said back face reinforcing metallic member and a partial area of the rear face of said back face reinforcing metallic member are covered by a resin. A process for the production of said solar module by way of thermocompression bonding process.

21 Claims, 6 Drawing Sheets

SOLAR CELL MODULE HAVING A BACK FACE REINFORCING MEMBER COVERED BY A RESIN AND A PROCESS FOR THE PRODUCTION OF SAID SOLAR CELL MODULE

BACKGROUND OF THE INVENTION

1. Field of the Invention

The present invention relates to a highly reliable solar cell module having an improved back face reinforcing member. More particularly, the present invention relates to a highly reliable solar cell module having a back face reinforcing member covered by a resin which is hardly deteriorated, which is free of layer separation at the interface between the back face reinforcing member and the filler. The present invention further relates to a process for producing said solar cell module.

2. Related Background Art

In recent years, public attention has been focused on solar cells capable of serving as a clean and non-exhaustable power generation source of supplying electric power without causing air pollution.

In order to use such a solar cell as a power generation source, it is usually designed into a solar cell module in a desired configuration which can be used as the power generation source. And such a solar cell module has been widely using in practice as the power generation source by installing it, for instance, on the ground or on a roof of a building. And it is expected to be usable as a large scale power generation source in the future.

In the case of a solar cell module configured such that it can be used by integrating with a building roof member (this solar cell module will be hereinafter referred to as building roof-unifying type solar cell module), it has advantages such that it is not necessary to use a particular supporting table therefor, and its installation can be conducted as a part of the building construction works and it is therefore possible to markedly reduce the installation costs.

In any case, for a solar cell, it is required to have sufficient durability against external environments such as temperature, humidity, external shocks and the like. Therefore, a conventional solar cell module is structured such that a solar cell (or a photovoltaic element) is sealed by a filler and a weatherable film or a glass plate as a protective member is disposed on the light incident side.

A particularly advantageous structure for a building roof-unifying type solar cell module is that a weatherable film as a surface protective member is disposed on the light incident side, a back face reinforcing member is disposed on the rear face side without using a frame at the periphery, and the non-power generation region containing the back face reinforcing member is bent by way of plasticity processing.

In the case of such a solar cell module having an improved physical strength attained by way of the bending treatment without using a frame, there are such advantages as will be described in the following. Because the solar cell module is free of a frame-related junction, no waterproof treatment is required to be conducted, and when it is used as a roof member of a building, it desirably functions to shelter from the rain. In addition, since no frame is used, it can be produced with a reasonable production cost. Further, the weight of the solar cell module is lighter than that of a solar cell module provided with a frame, and it can be readily handled. Besides these advantages, there is also an advantage in that when upon the installation, while taking advantage of the rigidity of the solar cell module, it can be readily connected with or laminated to other member by virtue of its flexibility, and therefore, it can be installed in a persistent and reliable state.

In the case where as the back face reinforcing member, a metallic member which is usually used as a metallic roof member of a building is used, the solar cell module can be processed and installed in a similar manner in the case of a ordinary roof member. This situation attains not only the formation of a reliable roof but also an improvement in the compatibility of the solar cell module with a metallic roof member.

However, for such a solar cell module provided with a back face reinforcing metallic member and having a plasticity-processed non-power generation region containing the back face reinforcing metallic member, when it is installed on a metallic roof of a building, there is a drawback due to corrosion of the metallic roof. Particularly, in the case of an ordinary metallic roof of a building, when it is corroded, the coating film thereof is raised and swelled to entail layer separation and other problems such as the occurrence of rusts including white and red rusts, and the like, where not only the exterior appearance of the roof is marred but also the roof is often bored into a useless state. These problems are significant when the metallic roof is exposed to salt-containing wind near the seashore or to acid rain containing corrosive materials caused due to changes in the environments such as air pollution.

In the case where a conventional solar cell module having a solar cell (a photovoltaic element) positioned on the surface side while being sealed by a covering material comprising a filler and a weatherable film is installed on the metallic roof, due to the foregoing rusts caused at the metallic roof, the solar cell module sometimes suffers from such problems as will be described in the following. The rusts sometimes invade into the inside of the solar cell module through its end portion to color or swell the covering material, where layer separation is liable to occur at the end portion of the solar cell module. These problems result in not only hindering the exterior appearance of the solar cell module but also deteriorating the performance of the solar cell.

Further, there is a tendency for the conventional solar cell module to have such problem as will be described in the following. That is, as above described, the solar cell is positioned on the surface side in the conventional solar cell module and because of this, it is extremely difficult to conduct maintenance works such as repacking even at the initial stage when a rust first occurs. Further, the solar cell module is usually installed on the roof on condition that it is used over a long period of time and therefore, it is not desirable to conduct reroofing as in the case of an ordinary metallic roof. In view of these situations, it is important for the solar cell module to be protected from being rusted. And there is a demand for improving the solar cell module so that no rust is occurred at the edge portions of the back face reinforcing metallic member.

Further in addition, for the conventional solar cell module, its edge portions are externally exposed and because of this, a problem is liable to entail in that because the edge portions of the back face reinforcing metallic member are externally exposed, when the solar cell module is continuously used in outdoors over a long period of time, the adhesion between the filler and the back face reinforcing metallic member is deteriorated to cause layer separation at the interface between the filler and the back face reinforcing metallic member. This problem is liable to readily occur at portions of the back face reinforcing metallic member which have been applied with plasticity-processing treatment such as bend treatment. Particularly, when the back face reinforcing metallic member is bent toward the direction where no filler is bonded, said problem is more liable to occur due to a bending distortion subjected to the filler.

Besides these problems, there is a tendency for the conventional solar cell module to have a further problem such that in the transportation, bending treatment or installation works therefor, when the solar cell module is contacted with other solar cell module, they are damaged with each other because of the exposed edge portions of their back face reinforcing metallic members. Particularly, in the case where the solar cell module is installed on a roof of a building, there is an occasion that an worker having little knowledge about how to handle the solar cell module is engaged in the installation work and he erroneously make the solar cell module contact with other solar cell module. In this case, the back face reinforcing metallic member of one of the solar cell modules has exposed sharp edge portions (or cut faces), the weatherable film as the surface protective film of the other solar cell module is damaged by said exposed sharp edge portions, where the damaged solar cell module becomes useless.

Further, in the case of subjecting a conventional solar cell module to bending treatment using a roller forming equipment having a pair of soft pressure rollers made of urethane resin or the like, a problem is liable to entail in that the exposed edge portion of the back face reinforcing metallic member damage the pressure rollers to shorten their lifetime.

SUMMARY OF THE INVENTION

An object of the present invention is to eliminate the foregoing problems in the prior art and provide a highly reliable solar cell module which is free from the problems found in the prior art.

Another object of the present invention is to provide a highly reliable solar cell module which can be desirably used by installing on a metallic roof of a building where it exhibits a desirable photoelectric conversion performance even when continuously used over a long period of time, without the occurrence of the foregoing problems due to the corrosion of the metallic roof found in the prior art.

A further object of the present invention is to provide a highly reliable solar cell module with no necessity of using a protecting means such as a metallic cover for preventing the occurrence of layer separation at the interface between the filler and the back face reinforcing metallic member and which can be desirably used as a roof member of a building.

A further object of the present invention is to provide a highly reliable solar cell module comprising a photovoltaic element (or a solar cell), a filler for encapsulating said photovoltaic element, and a back face reinforcing metallic member, wherein the end faces of said back face reinforcing metallic member and a partial area of the rear face of said back face reinforcing metallic member are covered by a resin.

A further object of the present invention is to provide a process for producing a solar cell module, comprising (a) a preparation step of stacking a filler material, a photovoltaic element (or a solar cell) and a back face reinforcing metallic member in the named order on a mounting table, and arranging a resin material so as to cover an end surface of said back face reinforcing metallic member and an end surface of said filler material while covering end faces of said back face reinforcing metallic member to form a stacked body situated on said mounting table, and (b) a sealing and uniting step of subjecting said stacked body to heat treatment.

A further object of the present invention is to provide a process for producing a solar cell module, comprising the steps of (a) providing a mounting table having a protruded table, (b) forming a stacked body comprising a filler material, a photovoltaic element (or a solar cell) and a back face reinforcing metallic member on said protruded table of the mounting table, (c) covering said stacked body by a covering sheet so as to hermetically enclose said stacked body between said covering sheet and said mounting table, and (d) heating and uniting said stacked body while exhausting the space containing said stacked body between said covering sheet and said mounting table.

A further object of the present invention is to provide a process for producing a solar cell module, comprising the steps of (a) providing a mounting table having a protruded table circumscribed by a recession, (b) forming a stacked body comprising a filler material, a photovoltaic element (or a solar cell) and a back face reinforcing metallic member on said protruded table of the mounting table, (c) covering said stacked body by a covering sheet so as to hermetically enclose said stacked body between said covering sheet and said mounting table, and (d) heating and uniting said stacked body while exhausting the space containing said stacked body between said covering sheet and said mounting table.

In the present invention, by covering the end faces of the back face reinforcing metallic member of the solar cell module by a rein, the back face reinforcing metallic member is effectively prevented from being deteriorated or corroded. This situation provides advantages in that the coated film of the back face reinforcing metallic member, which is situated in the vicinity of the end portions of the back face reinforcing metallic member, is prevented from being colored, separated and raised. And by covering a partial area of the rear face of the back face reinforcing metallic member by an extended portion of said resin, layer separation at the interface between the back face reinforcing metallic member and the filler is effectively prevented.

The above situations provides further advantages as will be described in the following. Not only during bending treatment of the solar cell module but also during transportation and installation of the solar cell module, there is not such an occasion that the solar cell modules are not damaged by the end portions of their back face reinforcing metallic members when they are contacted with each other and therefore, the occurrence of a defective solar cell module is prevented. In the case where the solar cell module is subjected to bending treatment by means of the roller forming equipment, the pressure rollers are prevented from being worn. Further, it is not necessary to use a metallic cover in order to prevent the back face reinforcing metallic member from being separated from the filler, and this situation makes it possible to establish a desirable roof of a simple configuration and having a good exterior appearance when the solar cell module is used as a roof member of a building. In this case, since such metallic cover as above described is not used, there is free of a problem found in the case of using the metallic cover in that dusts or the like are accumulated on the metallic cover. And there can be attained a reduction in the costs required in the roofing by solar cell modules.

Further in addition, the protected solar cell-free end portions of the solar cell module according to the present invention can be bent into a complicate configuration as desired, which is satisfactory in terms of protection.

The solar cell module according to the present invention can be desirably installed at a desired location as a power generation source. For instance, it can be installed on a roof of a building where it can serve also as a constituent member of the roof as above described. It can be also installed on an appropriate support table or on the ground. Further, it can be installed, for example, on a sound-proof wall where it can be serve also as a constituent member of the sound-proof wall.

DESCRIPTION OF THE INVENTION AND PREFERRED EMBODIMENTS

The present invention attains the above-described objects.

The present invention will be described with reference to the following embodiments. It should be understood that the scope of the present invention is not restricted to these embodiments.

As above described, the present invention provides a highly reliable solar cell module comprising a photovoltaic element (or a solar cell), a filler for encapsulating said photovoltaic element, and a back face reinforcing metallic element, wherein the end faces of said back face reinforcing metallic member and a partial area of the rear face of said back face reinforcing metallic member are covered by a resin.

The resin situated on the rear face of the back face reinforcing metallic member may be continued from the resin of covering the end faces of the back face reinforcing metallic member.

The resin by which the end faces of said back face reinforcing metallic member are covered and that by which the partial area of the rear face of said back face reinforcing metallic member may be the same as the resin by which the filler is constituted.

The solar cell module according to the present invention may have a surface protective film comprising a weatherable film on the light incident side.

Figure 1:
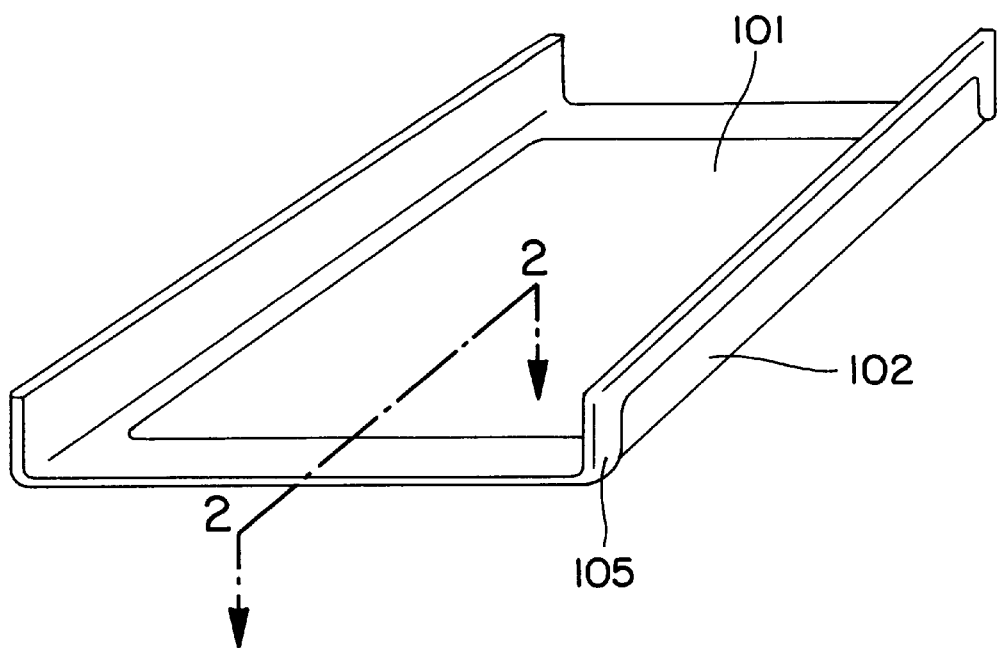
FIG. 1 is a schematic slant view illustrating the configuration of an example of a solar cell module according to the present invention.
Figure 2:
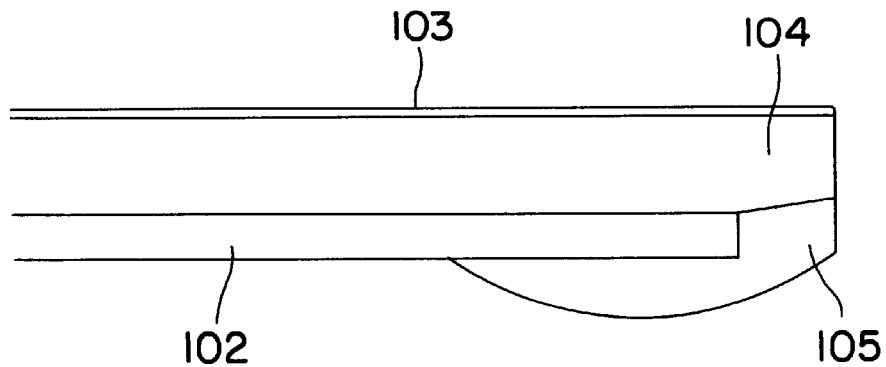
FIG. 2 is a schematic cross-sectional view, taken along the line A-A' in FIG. 1.

FIG. 1 is a schematic slant view illustrating the configuration of a typical example of a solar cell module according to the present invention. FIG. 2 is a schematic cross-sectional view, taken along the line A-A' in FIG. 1.

In FIGS. 1 and 2, reference numeral 101 indicates a photovoltaic element (or a solar cell) enclosed in the solar cell module (see, FIG. 1), reference numeral 102 indicates a back face reinforcing metallic member, reference numeral 103 a weatherable film as a surface protective film, reference numeral 104 a filler (comprising a resin) for encapsulating said photovoltaic element 101, and reference numeral 105 a resin of covering the end faces of said back face reinforcing metallic member 102 while covering a partial area of the rear face of the back face reinforcing metallic member.

In FIG. 2, the photovoltaic element 101 is embedded in the filler 104. But this is omitted in FIG. 2.

The solar cell module shown in FIGS. 1 and 2 has opposite bent non-power generation regions which enable to readily install the solar cell module at a desired location, for instance, on a roof of a building.

In the following, description will be made of each constituent of the solar cell module according to the present invention.

Photovoltaic Element 101 (or Solar Cell)

For the photovoltaic element 101 (or the solar cell) used in the present invention, there is no particular limitation. Any photovoltaic elements (or any solar cells) may be optionally used as long as they exhibit a photoelectric conversion performance as desired. However, it is desired to use a photovoltaic element (or a solar cell) which is thin and has a high shock resistance and a bending property. Specifically the photovoltaic element (or the solar cell) desirably usable in the present invention can include those having a substrate constituted by a metal or resin. Particularly, it is preferably to use an amorphous solar cell formed on a stainless steel substrate.

Figure 3:
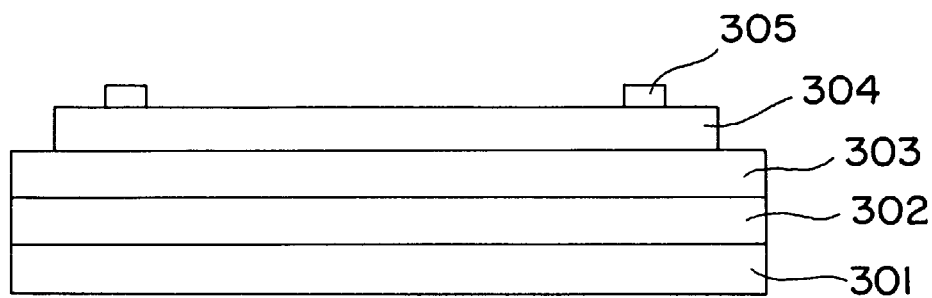
FIG. 3 is a schematic cross-sectional view illustrating the constitution of an example of a photovoltaic element (or a solar cell) which can be used in the present invention.

FIG. 3 is a schematic cross-sectional view illustrating a typical example of a photovoltaic element (or a solar cell) usable in the present invention.

In FIG. 3, reference numeral 301 indicates an electrically conductive substrate, reference numeral 302 a back reflecting layer, reference numeral 303 a semiconductor photoactive layer, reference numeral 304 a transparent and electrically conductive layer, and reference numeral 305 a collecting electrode (or a grid electrode).

The photovoltaic element shown in FIG. 3 comprises the back reflecting layer 302, the semiconductor photoactive layer 303, the transparent and electrically conductive layer 304, and the collecting electrode 305 disposed in the named order on the electrically conductive substrate 301, where an power outputting terminal (not shown) is electrically connected to the collecting electrode 305 and it is extending from the collecting electrode 305 while being insulated, and another outputting terminal (not shown) is electrically connected to the electrically conductive substrate 301.

The semiconductor photoactive layer 303 functions to conduct photoelectric conversions The semiconductor photoactive layer may be composed of a single crystal silicon semiconductor material, a non-single crystal silicon semiconductor material such as an amorphous silicon semiconductor material (including a microcrystalline silicon semiconductor material) or polycrystalline silicon semiconductor material, or a compound semiconductor material. In any case, the semiconductor photoactive layer comprised of any of these semiconductor materials may be of a stacked structure with a pin junction, a pn junction or a shottky type junction.

As the ptotovoltaic element 101 (or the solar cell) in the solar cell module shown in FIGS. 1 and 2 may be a solar cell comprising a plurality of photovoltaic elements having the above-described constitution integrated in series connection or in parallel connection depending upon a desired voltage or electric current.

Back Face Reinforcing Metallic Member 102

The back face reinforcing metallic member 102 serves to make the solar cell module have a sufficient physical strength in terms of structure and to prevent the solar cell module from being distorted or warped due to changes in the environmental atmosphere.

The back face reinforcing metallic member is desired to comprise a metallic member having a desired thickness which enables to make the solar cell module have a sufficient physical strength in terms of structure when its opposite end portions each belonging to the non-power generation region of the solar cell module are bent by way of forming treatment. Hence, the metallic member is desired to have a bendability and an excellent processing suitability. For the thickness of the metallic member as the back face reinforcing metallic member, it is desired to be in the range of from 0.2 mm to 2.0 mm.

The metallic member as the back face reinforcing metallic member is desired to excel in weatherability and corrosion resistance. In the case where the metallic member is not sufficient in terms of weatherability and corrosion resistance, it can be made to have a sufficient weatherability and corrosion resistance by subjecting to rust preventive treatment.

Further, the metallic member as the back face reinforcing metallic member is desired to have a sufficient adhesion with a layer such as a filler layer as the filler 104 and an adhesive which will be occasionally used.

Specific examples of the metallic member usable as the back face reinforcing metallic member are steel plates such as copper plate, aluminum alloy plate, lead plate, zinc plate, titanium plate, and stainless steel plate; special plated-steel plates such as Zn-plated steel plate, and Zn-Al alloy-plated steel plate; layered steel plates; and coated steel plates.

The back face reinforcing member has an effect on the exterior appearance of the solar cell depending on the installation configuration employed for the solar cell module. Therefore, it is desired to selectively use an appropriate metallic member having a desired color hue as the back face reinforcing metallic member depending on the installation configuration employed for the solar cell module. In this case, it is possible to color the metallic member as the back face reinforcing metallic member by coating it with a polyester resin series paint or an epoxy resin series paint in a state of having a desired color hue. Alternatively, the metallic member may be laminated with a desirably colored film in a state of having a desired color hue.

Resin 105

As above described, the end portions of the back face reinforcing metallic member 102 are covered by the resin 105 while the resin 105 covering also a partial area of the rear face of the back face reinforcing metallic member.

Particularly, it is necessary for the resin 105 to cover the end portions of the back face reinforcing metallic member 102 such that the resin covers at least the end cut faces of the back face reinforcing metallic member while the resin being extending to the rear face of the back face reinforcing metallic member, namely the back face reinforcing metallic member's face which intersects with said end cut faces on the side on the side where no photovoltaic element is arranged, to cover a partial area of said rear face.

For the shape of the resin 105 of covering the end portions of the back face reinforcing metallic member 102, there is no particular limitation. It may take any shape as long as the end portions of the back face reinforcing metallic member are sufficiently covered by the resin.

For the thickness of the resin of covering the end portions of the back face reinforcing metallic member, there is also no particular limitation as long as the end portions of the back face reinforcing metallic member are sufficiently covered by the resin. Even when the thickness of the resin is relatively thinned, there is provided an adequate protective effect in terms of deterioration prevention of the metallic member as the back face reinforcing metallic member.

For the resin 105 situated on the rear face of the back face reinforcing metallic member, it is desired to be relatively thin in view of the processing efficiency. In view of preventing the resin from being separated, it is desired to be relatively thick. In any case, the thickness of the resin situated on the rear face of the back face reinforcing metallic member is not necessary to be constant.

In a preferred embodiment, it is made such that the end portions of the back face reinforcing metallic member 102 are covered by a relatively thick resin layer of the resin 105 and the resin layer is extended to cover a partial area of the rear face of the back face reinforcing metallic member at a thickness which is gradually thinned toward the center of the rear face of the back face reinforcing metallic member.

The resin 105 is desired to have a flexibility or deformability which can follow the movement of the back face reinforcing metallic member when bent upon the bending treatment. Further, the resin 105 is desired to have a sufficient adhesion with the back face reinforcing member, as previously described. In addition, the resin 105 is desired to have a certain physical strength also in order to prevent the occurrence of layer separation at the interface between the filler and the back face reinforcing metallic member.

The resin 105 is desired to comprise a thermoplastic resin. Such thermoplastic resin can include, for example, ethylene-vinyl acetate copolymer (EVA), ethylene-acrylate copolymer (EEA), polyvinyl butyral (PVB), silicone resin, and acrylic resin.

As the resin 105, it is possible to use the same material used as the filler. In this case, there is provided an improvement in the working efficiency in the production of a solar cell module.

Weatherable Film 103 (or Surface Protective Film)

The weatherable film 103 (or the surface protective film) is positioned at the outermost surface of the solar cell module. It is required to excel in weatherability, pollution resistance, transparency, water repellency, and physical strength. In order for the weatherable film to have an improved pollution resistance, it may contain a volatile component.

The weatherable film is necessary to have a property which can follow the movement of the back face reinforcing metallic member when bent upon the bending treatment, without being broken. And in general, the weatherable film is desired to have a large elongation persentage.

Therefore, the weatherable film is comprised of an appropriate transparent resin film which satisfies the above-described requirements. Such film can include fluororesin films.

Specific examples of the fluororesin film are polyvinylidene fluoride resin films, polyvinyl fluoride resin films, and tetrafluoroethylene-ethylene copolymer films.

In order to attain a further improvement in the adhesion of the weatherable film 103 with the filler 104, a given surface of the weatherable film to be contacted with the filler is desired to be subjected to surface treatment by way of corona discharge treatment, plasma treatment, ozone treatment, or the like.

In the case where the resin film as the weatherable film comprises an oriented resin film, there is a tendency for the oriented film to be cracked. Therefore, the resin film as the weatherable film is desired to comprise a non-oriented resin film.

Filler 104

The filler 104 serves to encapsulate the photovoltaic element 101 (or the solar cell) so as to form a layer of the filler in which the photovoltaic element is embedded while the irregularities present at the periphery of the photovoltaic element being filled by the filler and which has opposite faces, one being contacted with the weaterable film 103 and the other being contacted with the back face reinforcing member 102.

The filler 104 is desired to excels in workability because the back face reinforcing metallic member is subjected to bending treatment.

The filler 104 situated on the light incident side is required to have a property of adequately allowing light used for photoelectric conversion to transmit therethrough to arrive at the photovoltaic element 101 so that a sufficient photoelectric conversion efficiency is attained by the photovoltaic element.

The filler 104 is desired to be constituted by an appropriate resin which can be desirably bonded with not only the photovoltaic element 101 but also the back face reinforcing metallic member 102 and the weatherable film 103 with a sufficient adhesion.

As most desirable examples of such resin, there can be mentioned thermoplastic resins. The use of these thermoplastic resins as the filler 104 enables to readily encapsulate the photovoltaic element 101 while sufficiently filling the irregularities present at the periphery of the photovoltaic element, resulting in forming a layer of the filler 104 in which the photovoltaic element is embedded in a desirable state and which has flat opposite faces, one being bonded with the weaterable film 103 with a sufficient adhesion and the other being bonded with the back face reinforcing member 102 with a sufficient adhesion.

Specific examples of the thermoplastic resin usable as the filler 104 are ethylene-vinyl acetate copolymer (EVA), ethylene-acrylate copolymer (EEA), polyvinyl butyral (PVB), silicone resin, and acrylic resin.

In order for the filler 104 to have an improved heat resistance, the filler 104 may contain a crosslinking agent, thermal oxidation preventive agent or the like.

In order for the the filler 104 to have a improved weatherability, the filler may contain an UV absorber.

Further, the filler 104 may contain an appropriate sheet-like filler-retaining member such as a sheet-like woven or nonwoven glass fiber member or a sheet-like woven or nonwoven polypropylene fiber member in a state that the filler-retaining member is embedded in the filler.

For the thickness of the filler 104, it is preferably in the range of from 0.3 mm to 2 mm.

By the way, the filler 104 situated on the rear side of the photovoltaic element 101 may comprise a opaque resin. Particularly in this respect, the filler 104 may be configured to have a plurality of different regions each constituted a different resin. For instance, a surface side region of the filler 104 situated on the light incident side of the photovoltaic element is constituted by a specific resin (a light transmissive (or transparent) resin) and a back side region of the filler situated on the rear side of the photovoltaic element is constituted by other appropriate resin, or a region of the filler where the photovoltaic element is present is constituted by said specific resin and the remaining region of the filler where no photovoltaic element is present is constituted other appropriate resin.

Now, for the solar cell module according to the present invention, it is not always necessary to have such opposite bent non-power generation regions as shown in FIG. 1. It may be used as it is in a state without having being subjected to bending treatment by way of plasticity-processing.

In the present invention, for the shape of the bent portion of the solar cell module which is formed by way of plasticity-processing, there is no particular limitation.

The formation of the bent portion may be conducted by means of bending treatment, press working or the like.

In any case, the bent portion is desired to comprise a non-power generation region with no photovoltaic element which has been plasticity-processed.

In the case of forming the bent portion by means of the bending treatment, it is desired to bend a predetermined non-power generation region of the solar cell module at a gentle bending angle R while having a due care so that neither film nor resin are damaged or separated. For the direction in which the non-power generation region is bent by means of the bending treatment, it is possible to bend the non-power generation region toward the light receiving face side of the photovoltaic element, toward the rear side of the photovoltaic element, or toward these two sides so that the non-power generation region is shaped to have a desired configuration. In this case, there is no particular limitation for the manner of the bending treatment and also for a bending equipment employed in the bending treatment.

In order to prevent the surface of the solar cell module from being damaged in the bending treatment, to use a blade, die or roll which are made of a material which hardly damages the surface of the solar cell module is desirable. In the bending treatment using any of these instruments, it is possible to use a soft resin member made of an urethane resin or the like at a portion of the solar cell module which is contacted with the instrument.

The solar cell module according to the present invention may be installed at a desired location. For instance, it may be installed on a roof of a building, in terms of effective utilization of the ground and also in terms of burglarproof and the like. This is not limitative, but it may be installed at other appropriated location, for example, on the ground, a support table or the like.

As previously described, the solar cell module with no bent non-power generation region according to the present invention may be produced by way of thermocompression bonding process. For instance, it may be produced by a manner of forming a stacked body comprising the foregoing constituent members for a solar cell module on a mounting table of a laminator, covering the stacked body by a covering sheet so as to hermetically enclose the stacked body between the covering sheet and the mounting table, and heating and uniting the stacked body while exhausting the space containing the stacked body between the covering sheet and the mounting table, followed by cooling to room temperature while continuing the vacuuming operation, and returning the inside of the space containing the stacked body between the covering sheet and the mounting table to atmospheric pressure to take out the treated stacked body.

In the following, the present invention will be described in more detail with reference to examples which are not intended to restrict the scope of the present invention.

EXAMPLE 1

In this example, there were prepared two solar cell modules having the configuration shown in FIGS. 1 and 2.

Figure 4:
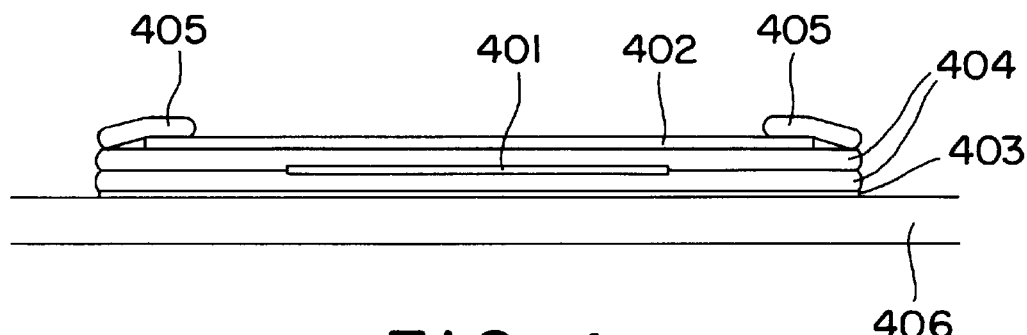
FIGS. 4 and 5 are schematic views for explaining a example of a process for producing a solar cell module according to the present invention.
Figure 5:
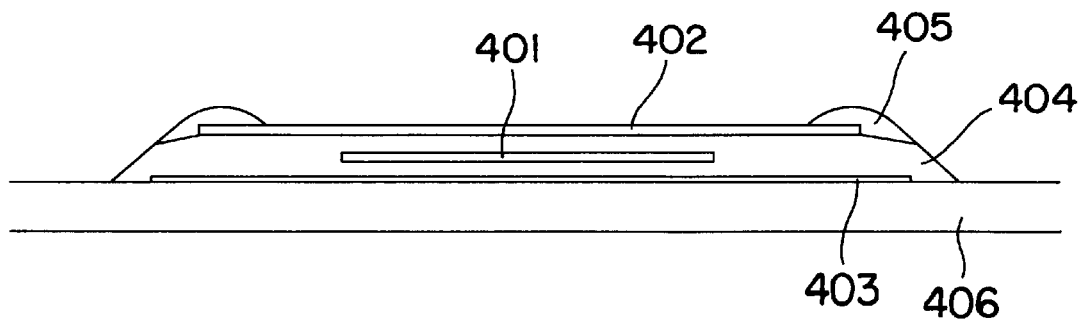

Each solar cell module was prepared in a manner shown in FIGS. 4 and 5.

FIG. 4 is a schematic cross-sectional view illustrating a stacked body in process for the preparation of a solar cell module formed on a mounting table of a laminater. FIG. 5 is a schematic cross-sectional view illustrating a thermocompressed stacked body as a solar cell module situated on the mounting table.

In FIGS. 4 and 5, reference numeral 401 indicates a solar cell element (or a photovoltaic element), reference numeral 402 a back face reinforcing metallic member, reference numeral 403 a light transmissive surface protective film having a weatherability, reference numeral 404 a filler, reference numeral 405 a resin for covering an end portion of the back face reinforcing member 402, and reference numeral 406 a mounting table of a laminater (not shown).

The laminater (not shown) comprises said mounting table 406 and a heat resistant silicone rubber sheet (not shown) which serves to enclose an object comprising a stacked body (to be subjected to thermocompression treatment) positioned on the mounting table. The mounting table 406 is made of a stainless steel and it is provided with a heating mechanism such as an electric heater (not shown) for heating the object. The mounting table 406 is also provided with a heat resistant O-ring (not shown) and an exhaust system connected to a vacuum pump (not shown).

Each solar cell module was prepared as will be described below.

1. Provision of solar cell 401:

As the solar cell 401, there was provided a solar cell comprising three photovoltaic elements of the configuration shown in FIG. 3, integrated in series connection.

The solar cell was prepared in the following manner.

(1). Preparation of three photovoltaic elements:

Each photovoltaic element was prepared in the following manner.

There was first provided a well-cleaned stainless steel plate as a substrate 301. On the substrate 301, there was formed a two-layered back reflecting layer 302 comprising a 5000 Å thick Al film/a 5000 Å thick ZnO film by means of the conventional sputtering process. On the back reflecting layer 302 thus formed, there was formed a tandem type amorphous silicon (a-Si) photoelectric conversion semiconductor layer as as a semiconductor photoactive layer 303 comprising a 150 Å thick n-type amorphous silicon layer/a 4000 Å thick i-type amorphous silicon layer/a 100 Å thick p-type microcrystalline silicon layer/a 100 Å thick n-type amorphous silicon layer/a 800 Å thick i-type amorphous silicon layer/a 100 Å thick p-type microcrystalline silicon layer laminated in the named order from the substrate side by means of the conventional plasma CVD process, wherein each n-type amorphous silicon layer was formed using $SiH_4$ gas, $PH_3$ gas and $H_2$ gas, each i-type amorphous silicon layer was formed using $SiH_4$ gas and $H_2$ gas, and each p-type microcrystalline silicon layer was formed using $SiH_4$ gas, $BF_3$ gas and $H_2$ gas. Then, on the semiconductor photoactive layer 303, there was formed a 700 Å thick transparent and electrically conductive layer 304 composed of $In_2O_3$ by means of the conventional heat resistance evaporation process wherein an In source was evaporated in an $O_2$ atmosphere. Successively, an Ag-paste comprising powdery Ag dispersed in a polyester resin was screen-printed on the transparent and electrically conductive layer 304, followed by drying, to thereby form a grid electrode as a collecting electrode 305. As for the resultant, a copper tub as a negative side power outputting terminal was fixed to the substrate 301 using a stainless solder, and a tin foil tape as a positive side power outputting terminal was fixed to the collecting electrode 305 using an electrically conductive adhesive. Thus, there was obtained a photovoltaic element.

The above procedures were repeated to obtain three photovoltaic elements.

(2). Preparation of solar cell:

The three photovoltaic elements obtained in the above step (1) were linearly arranged, and they were integrated in series connection by electrically connecting the positive side power outputting terminal of one photovoltaic element to the negative power outputting terminal of the other photovoltaic element adjacent to the former photovoltaic element by using a solder.

Thus, there was obtained a solar cell.

In this way, there were prepared two solar cells.

2. Preparation of solar cell module:

Using each of the two solar cells obtained in the above 1, there were prepared two solar cell modules of the configuration shown in FIGS. 1 and 2.

Each solar cell module was prepared in the manner shown in FIGS. 4 and 5.

As the back face reinforcing metallic member 402, there was provided a 0.4 mm thick Zn-plated steel plate coated by a polyester resin (trademark name: COLORGRIP, produced by Daidokohan Kabushiki Kaisha) having a pair of wiring holes of 15 mm in diameter through which the pair of power outputting terminals of the solar cell can be wired to the outside.

As the filler 404, there were provided two 900 $\mu$m thick EVA (ethylene-vinyl acetate copolymer) sheets having a weatherability (trademark name: EVAFLEX 150, produced by Mitsui-Du Pont Chemical Company).

As the resin 405, there was provided a EVA (ethylenevinyl acetate copolymer) sheet having a weatherability (trademark name: EVAFLEX 150, produced by Mitsui-Du Pont Chemical Company).

As the surface protective film 403, there was provided a 50 $\mu$m thick ETFE (ethylene-tetrafluoroethylene copolymer) film (trademark name: AFLEX, produced by Asashi Glass Kabushiki Kaisha) having a corona-discharged surface to be contacted with the EVA sheet 404.

The size of each of the back face reinforcing metallic member 402, EVA sheets 404 and the ETFE film 403 was made to be greater than that of the solar cell 401. However, the size of the back face reinforcing member 402 was made to be smaller than those of the EVA sheets 404 and the ETFE film 403. The EVA sheet as the resin 405 was made to have a shape capable of covering the peripheral end portions of the back face reinforcing metallic member 402.

As shown in FIG. 4, on the surface of the mounting table 406, there were laminated the ETFE film 403, the EVA sheet 404, the solar cell 401, the EVA sheet 404, and the back face reinforcing metallic member 402 in the named order, followed by laminating the EVA sheet 405 so as to cover the peripheral end portions of the back face reinforcing metallic member 402, to thereby form a stacked body situated on the mounting table 406.

Then, the above-described heat resistant silicone rubber sheet (not shown) was superposed over the stacked body on the mounting table 406 while sealing between the mounting table and the silicone rubber sheet by means of the above-described heat resistant O-ring (not shown). Thereafter, the above-described vacuum pump (not shown) was operated to exhaust the inside of the space containing the stacked body between the silicone rubber sheet and the mounting table 406 through the above-described exhaust system to a vacuum degree of about 10 Torr, where the silicone rubber sheet was sagged toward the mounting table 406 to compress the stacked body. While continuing the vacuuming operation by the vacuum pump, the stacked body was subjected to heat treatment at 150° C. for 30 minutes by means of the above-described heating mechanism. Thereafter, while still continuing the vacuuming operation by the vacuum pump, the stacked body was air-cooled to room temperature. The operation of the vacuum pump was terminated to return the inside of the space containing the stacked body between the silicone rubber sheet and the mounting table 406 to atmospheric pressure, followed by removing the silicone rubber sheet (see, FIG. 5). Then, the treated stacked body was taken out from the mounting table. The treated stacked body was found to have unnecessary external projections comprising EVA resin. The projections were cut to remove. The resultant was found to have an EVA resin layer 405 (see, FIG. 5) extending to the rear face of the back face reinforcing metallic member 402 to cover a partial area of the rear face while covering the peripheral end portions of the back face reinforcing member. The extended EVA resin layer situated on the rear face of the back face reinforcing metallic member 402 was found to have a maximum thickness of 0.5 mm and the EVA resin layer of covering the peripheral end portions of the back face reinforcing metallic member was found to be 2 mm in thickness.

3. Shaping:

Using a molding equipment, the solar cell-free opposite side end portions of the resultant were bent as shown in FIG. 1.

Thus, there was obtained a solar cell module having opposite bent portions in which the solar cell 401 is sealed by the filler 404, the surface protective film 403 and the back face reinforcing metallic member 402 and which has a resin layer of covering the peripheral end portions of the back face reinforcing metallic member 402 while the rein layer being extended to also cover a partial area of the rear face thereof.

In this way, there were obtained two solar cell modules having the configuration shown in FIGS. 1 and 2.

Evaluation

For the resultant two solar cell modules, evaluation was conducted by way of salt spray test and acid rain cycle test.
(1) The salt spray test:

One of the two solar cell modules was subjected to repetition of a cycle comprising spraying a 5 wt. % salt water having a pH value of 7.0 for 2 hours, drying for 4 hours and moisture-wetting for 2 hours 180 times.
(2) The acid rain cycle test:

The remaining solar cell module was subjected to repetition of a cycle comprising spraying an acid rain solution of pH 3.5 (composed of 5 wt. % neutral NaCl solution, nitric acid and NaOH aqueous solution) for 24 hours and drying for 24 hours 24 times.

As a result, in both the salt spray test and the acid rain cycle test, neither rust nor color change were occurred at the entire of the back face reinforcing member. In addition, neither bulging nor layer separation were occurred at the filler not only in the solar cell-bearing portion but also in the solar cell-free bent portions.

EXAMPLE 2

The procedures of Example 1 were repeated, except that as the back face reinforcing metallic member, a 0.4 mm thick galvernized steel plate (trademark name: TIMERCOLOR GL, produced by Daidokohan Kabushiki Kaisha) coated by a polyester resin was used, to thereby obtain two solar cell modules having the configuration shown in FIGS. 1 and 2.

For the resultant two solar cell modules, evaluation was conducted by way of the salt spray test and the acid rain cycle test in the same manner as in Example 1.

As a result, in both the salt spray test and the acid rain cycle test, neither rust nor color change were occurred at the entire of the back face reinforcing member. In addition, neither bulging nor layer separation were occurred at the filler not only in the solar cell-bearing portion but also in the solar cell-free bent portions.

EXAMPLE 3

In this example, there were prepared two solar cell modules having the configuration shown in FIGS. 1 and 2.

Figure 6:
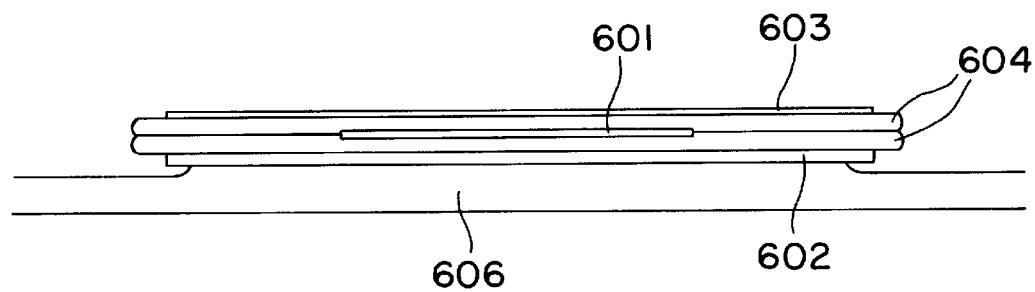
FIGS. 6, 7 and 8 are schematic views for explaining another example of a process for producing a solar cell module according to the present invention.
Figure 7:
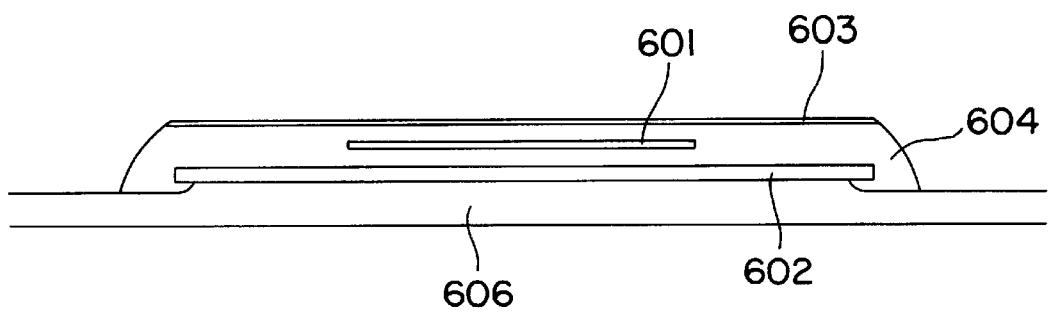
Figure 8:
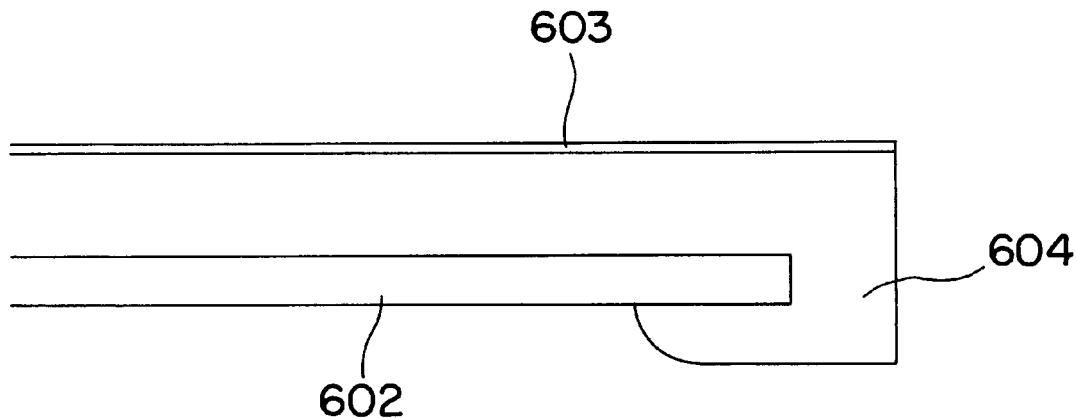

Each solar cell module was prepared in a manner shown in FIGS. 6, 7 and 8.

FIG. 6 is a schematic cross-sectional view illustrating a stacked body in process for the preparation of a solar cell module formed on a mounting table of a laminater. FIG. 7 is a schematic cross-sectional view illustrating a thermocompressed stacked body as a solar cell module situated on the mounting table. FIG. 8 is a schematic cross-sectional view showing the configuration of an end portion of the thermocompressed stacked body removed from the mounting table.

In FIGS. 6, 7 and 8, reference numeral 601 indicates a solar cell element (or a photovoltaic element), reference numeral 602 a back face reinforcing metallic member, reference numeral 603 a light transmissive surface protective film having a weatherability, reference numeral 604 a filler, and reference numeral 606 a mounting table of a laminater (not shown).

The laminater (not shown) comprises said mounting table 606 and a heat resistant silicone rubber sheet (not shown) which serves to enclose an object comprising a stacked body (to be subjected to thermocompression treatment) positioned on the mounting table. The mounting table 606 is made of a stainless steel and it is shaped to have a protruded table with a cross section in a trapezoid-like form having a circular necking in order to establish a space between the rear face of the back face reinforcing member 602 for a resin fluid to be flown thereinto. This protruded table may be a protruded area circumscribed by a recession such as a groove on the mounting table 606. The recession in this case serves as said space.

The mounting table 606 is provided with a heating mechanism such as an electric heater (not shown) for heating the object. The mounting table 606 is also provided with a heat resistant O-ring (not shown) and an exhaust system connected to a vacuum pump (not shown).

Each solar cell module was prepared as will be described below.

1. Provision of solar cell 601:

As the solar cell 601, there was provided a solar cell comprising three photovoltaic elements of the configuration shown in FIG. 3, integrated in series connection.

The solar cell was prepared in accordance with the procedures described in the step 1 in Example 1 for the preparation of a solar cell.

In this way, there were prepared two solar cells.

2. Preparation of solar cell module:

Using each of the two solar cells obtained in the above 1, there were prepared two solar cell modules of the configuration shown in FIGS. 1 and 2.

Each solar cell module was prepared in the manner shown in FIGS. 6, 7 and 8.

As the back face reinforcing metallic member 602, there was provided a 0.4 mm thick Zn-plated steel plate coated by a polyester resin (trademark name: COLORGRIP, produced by Daidokohan Kabushiki Kaisha) having a pair of wiring holes of 15 mm in diameter through which the pair of power outputting terminals of the solar cell can be wired to the outside.

As the filler 604, there were provided two 900 $\mu$m thick EVA (ethylene-vinyl acetate copolymer) sheets having a weatherability (trademark name: EVAFLEX 150, produced by Mitsui-Du Pont Chemical Company).

As the surface protective film 603, there was provided a 50 $\mu$m thick ETFE (ethylene-tetrafluoroethylene copolymer) film (trademark name: AFLEX, produced by Asashi Glass Kabushiki Kaisha) having a corona-discharged surface to be contacted with the EVA sheet 604.

The size of each of the back face reinforcing metallic member 602, EVA sheets 604 and the ETFE film 603 was made to be greater than that of the solar cell 601. And the size of each of the two EVA sheets 604 was made to be greater than those of the back face reinforcing metallic member 602 and the ETFE film 603.

As shown in FIG. 6, on the surface of the protruded table of the mounting table 606, there were laminated the back face reinforcing metallic member 602, the EVA sheet 604, the solar cell 601, the EVA sheet 604 and the ETFE film 603 in the named order to thereby form a stacked body situated on the protruded table of the mounting table 606.

Then, the above-described heat resistant silicone rubber sheet (not shown) was superposed over the stacked body on the protruded table of the mounting table 606 while sealing between the mounting table 606 and the silicone rubber sheet by means of the above-described heat resistant O-ring (not shown). Thereafter, the above-described vacuum pump (not shown) was operated to exhaust the inside of the space containing the stacked body between the silicone rubber sheet and the mounting table 606 through the above-described exhaust system to a vacuum degree of about 10 Torr, where the silicone rubber sheet was sagged toward the mounting table 606 to compress the stacked body. While continuing the vacuuming operation by the vacuum pump, the stacked body was subjected to heat treatment at 150° C. for 30 minutes by means of the above-described heating mechanism, where the EVA sheets 604 were fluidized to flow into the space between the necking of the protruded table of the mounting table 606 and the back face reinforcing member 602 while covering the entire of the peripheral end portions of the back face reinforcing member 602 as shown in FIG. 7. Thereafter, while still continuing the vacuuming operation by the vacuum pump, the thus treated stacked body was air-cooled to room temperature. The operation of the vacuum pump was terminated to return the inside of the space containing the treated stacked body between the silicone rubber sheet and the mounting table 606 to atmospheric pressure, followed by removing the silicone rubber sheet. Then, the treated stacked body was taken out from the mounting table 606.

By this, there was obtained a product having the configuration shown in FIG. 8. The product was found to have unnecessary external projections comprising EVA resin. The projections were cut to remove. The resultant was found to have an EVA resin layer 604 (see, FIG. 8) extending to the rear face of the back face reinforcing metallic member 602 to cover a partial area of the rear face while covering the peripheral end portions of the back face reinforcing metallic member. The extended EVA resin layer situated on the rear face of the back face reinforcing metallic member 602 was found to have a maximum thickness of 0.5 mm and the EVA resin layer of covering the peripheral end portions of the back face reinforcing metallic member was found to be 2 mm in thickness.

The solar cell-free opposite side end portions of the resultant were bent as shown in FIG. 1 in the same manner as in Example 1.

Thus, there was obtained a solar cell module having opposite bent portions in which the solar cell 601 is sealed by the filler 604, the surface protective film 603 and the back face reinforcing metallic member 602 and which has a resin layer of covering the peripheral end portions of the back face reinforcing member 602 while the rein layer being extended to also cover a partial area of the rear face thereof.

In this way, there were obtained two solar cell modules having the configuration shown in FIG. 1.

For the resultant two solar cell modules, evaluation was conducted by way of the salt spray test and the acid rain cycle test in the same manner as in Example 1.

As a result, in both the salt spray test and the acid rain cycle test, neither rust nor color change were occurred at the entire of the back face reinforcing member. In addition, neither bulging nor layer separation were occurred at the filler not only in the solar cell-bearing portion but also in the solar cell-free bent portions.

EXAMPLE 4

Figure 9:
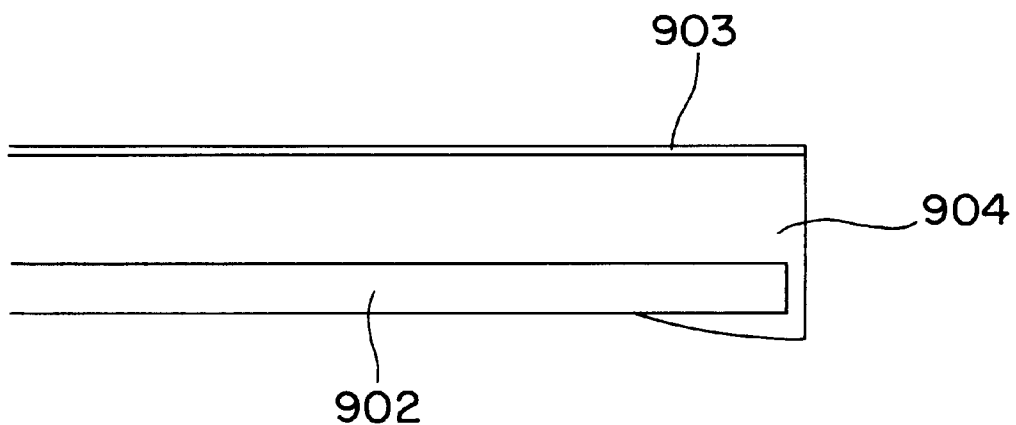
FIG. 9 is a schematic cross-sectional view illustrating the configuration of an example of a principal end portion of a solar cell module according to the present invention.

The procedures of Example 3 were repeated, except that the protruded table of the mounting table 606 was changed to a protruded table with a cross section in a trapezoid-like form having a linear necking capable of establishing a space between the rear face of the back face reinforcing metallic member for a resin fluid to be flown thereinto, to thereby obtain a solar cell module having peripheral end portions configured as shown in FIG. 9.

Particularly, the solar cell module obtained has solar cell-free opposite bent portions as shown in FIG. 1 and in which as shown in FIG. 9, the solar cell (not shown) is sealed by the filler 904, the surface protective film 903 and the back face reinforcing metallic member 902 and the solar cell module has an EVA resin layer of covering the peripheral end portions of the back face reinforcing metallic member 902 while the rein layer being extended to also cover a partial area of the rear face thereof as shown in FIG. 9.

The extended EVA resin layer situated on the rear face of the back face reinforcing metallic member 902 was found to have a maximum thickness of 0.2 mm and the EVA resin layer of covering the peripheral end portions of the back face reinforcing metallic member was found to be 1 mm in thickness.

In this way, there were obtained two solar cell modules having the configuration shown in FIG. 1.

For the resultant two solar cell modules, evaluation was conducted by way of the salt spray test and the acid rain cycle test in the same manner as in Example 1.

As a result, in both the salt spray test and the acid rain cycle test, neither rust nor color change were occurred at the entire of the back face reinforcing member. In addition, neither bulging nor layer separation were occurred at the filler not only in the solar cell-bearing portion but also in the solar cell-free bent portions.

EXAMPLE 5

Figure 10:
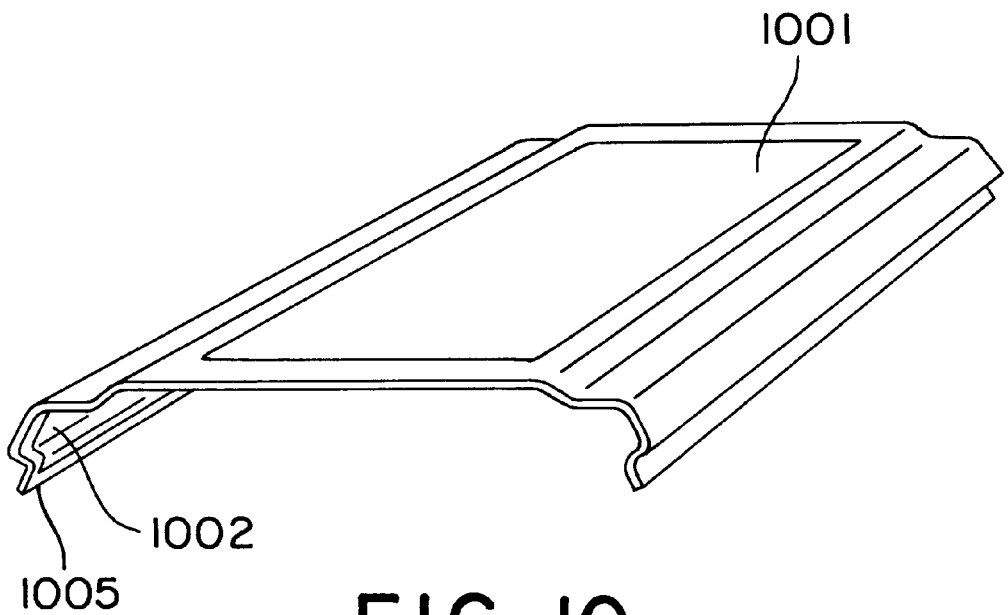
FIG. 10 is a schematic slant view illustrating the configuration of a further example of a solar cell module according to the present invention.

In this example, there were prepared two solar cell modules having the configuration shown in FIG. 10.

In FIG. 10, reference numeral 1001 indicates a solar cell enclosed in the solar cell module, reference numeral 1002 a back face reinforcing metallic member, and reference numeral 1005 an EVA resin layer.

Each solar cell module was prepared in the following manner.

The procedures of the steps 1 and 2 of Example 1 were repeated to obtain a solar cell module.

The resultant solar cell module was subjected to bending treatment using a roller forming equipment having a pair of pressure rollers capable of conveying a sheet at a constant speed while press-forming the sheet, where each of the solar cell-free opposite end portions was passed through between the pressure rollers to intermittently bend several positions thereof to obtain a solar cell modules having opposite portions each having been bent at several positions thereof as shown in FIG. 10.

Thus, there were obtained two solar cell modules having the configuration shown in FIG. 10.

For the resultant two solar cell modules, evaluation was conducted by way of the salt spray test and the acid rain cycle test in the same manner as in Example 1.

As a result, in both the salt spray test and the acid rain cycle test, neither rust nor color change were occurred at the entire of the back face reinforcing metallic member. In addition, neither bulging nor layer separation were occurred at the filler not only in the solar cell-bearing portion but also in the solar cell-free bent portions.

EXAMPLE 6

The procedures of Example 1 were repeated, except that the EVA sheet as the resin 405 to cover the peripheral end portions of the back face reinforcing metallic member 402 was replaced by an EEA resin (ethylene-acrylate copolymer resin; trademark name: EVAFLEX-EVA, produced by Mitsui Du Pont Chemical Kabushiki Kaisha) sheet, to obtain two solar cell modules having the configuration shown in FIGS. 1 and 2.

For the resultant two solar cell modules, evaluation was conducted by way of the salt spray test and the acid rain cycle test in the same manner as in Example 1.

As a result, in both the salt spray test and the acid rain cycle test, neither rust nor color change were occurred at the entire of the back face reinforcing metallic member. In addition, neither bulging nor layer separation were occurred at the filler not only in the solar cell-bearing portion but also in the solar cell-free bent portions.

COMPARATIVE EXAMPLE 1

Figure 11:
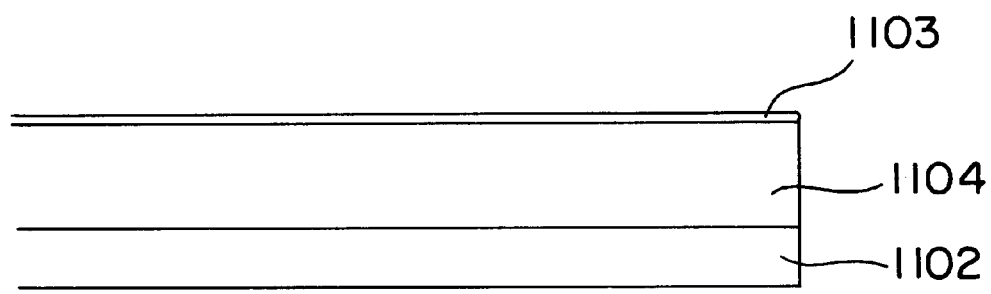
FIG. 11 is a schematic cross-sectional view illustrating the configuration of an example of a conventional solar cell module.

The procedures of the steps 1 and 2 of Example 1 were repeated, except that the peripheral end portions of the back face reinforcing metallic member was exposed without being covered by the EVA resin layer as in Example 1, to thereby obtain two solar cell modules having the configuration shown in FIG. 11. In FIG. 11, reference numeral 1102 indicates a back face reinforcing metallic member with no cover, reference numeral 1103 a surface protective film, and reference numeral 1104 an EVA filler.

The solar cell-free opposite end portions of each solar cell module were bent in the same manner as in Example 1.

Thus, there were obtained two solar cell modules having the opposite bent end portions.

For the resultant two solar cell modules, evaluation was conducted by way of the salt spray test and the acid rain cycle test in the same manner as in Example 1.

As a result, in both the salt spray test and the acid rain cycle test, corroded products were generated on all over the cut faces of the back face reinforcing metallic member and the back face reinforcing metallic member was partly rusted. In addition, on the front side of the solar cell module, the occurrence of a color change was observed at a portion of the back face reinforcing metallic member which is some centimeters distant from the edge. Further in addition, bulging and layer separation were occurred at the filler not only in the solar cell-bearing portion but also in the solar cell-free bent portions.

COMPARATIVE EXAMPLE 2

Figure 12:
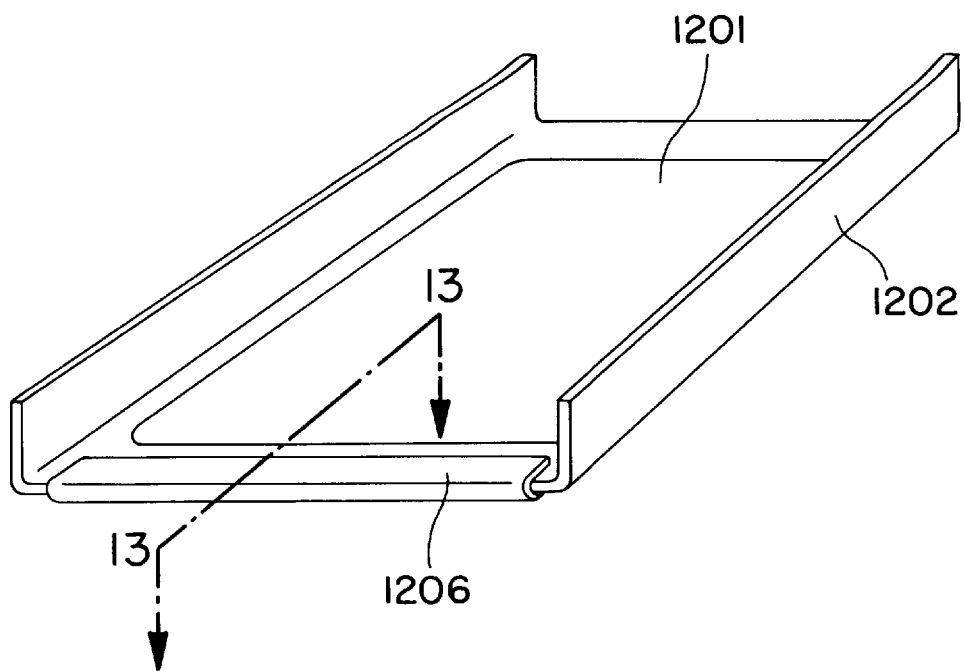
FIG. 12 is a schematic slant view illustrating the configuration of another example of a conventional solar cell module.
Figure 13:
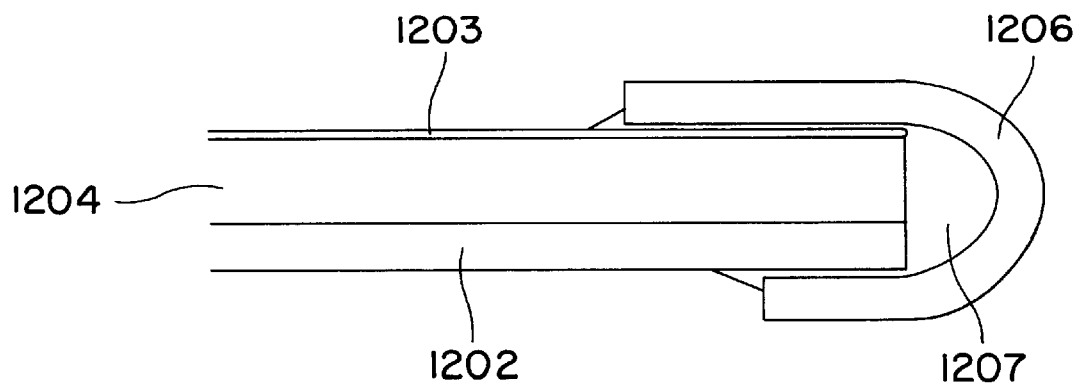
FIG. 13 is a schematic cross-sectional view, taken along the line B-B' in FIG. 12.

In this comparative example, there were prepared two solar cell modules having the configuration shown in FIGS. 12 and 13.

FIG. 12 is a schematic slant view of the entire of a solar cell module having opposite bent portions and having a coated, curved stainless steel plate fitted to an end portion of the flat area of the solar cell module. FIG. 13 is a schematic cross-sectional view, taken at the line B-B' in FIG. 12.

In FIGS. 12 and 13, reference numeral 1201 indicates a solar cell enclosed in the solar cell module, reference numeral 1202 a back face reinforcing metallic member, reference numeral 1203 a surface protective film, reference numeral 1204 a filler, reference numeral 1206 a coated stainless steel plate curved at 180°, and reference numeral 1207 a silicone sealant.

Each solar cell module was prepared in the following manner.

The procedures of the steps 1 and 2 of Example 1 were repeated, except that the peripheral end portions of the back face reinforcing metallic member was exposed without being covered by the EVA resin layer as in Example 1, to thereby obtain a solar cell module having the same configuration as that shown in FIG. 11.

The solar cell-free opposite end portions of the resultant solar cell module were bent in the same manner as in Example 1.

Then, for the two solar cell module having the opposite bent portions, a coated stainless steel plate 1206 having curved at 180° was fitted to an end portion of the flat area of the solar cell module. And the space between the end of the flat area of the solar cell module and the stainless steel plate 1206 was filled by a silicone sealant 1207.

Thus, there were obtained two solar cell modules having the configuration shown in FIGS. 12 and 13.

For the resultant two solar cell modules, evaluation was conducted by way of the salt spray test and the acid rain cycle test in the same manner as in Example 1.

As a result, in both the salt spray test and the acid rain cycle test, no problem was occurred at the back face reinforcing metallic member's portion covered by the coated stainless steel plate but at the remaining portion of the back face reinforcing metallic member not covered by the coated stainless steel plate, corroded products were generated on all over the cut faces of the back face reinforcing metallic member and the back face reinforcing metallic member was partly rusted. In addition, on the front side of the solar cell module, the occurrence of a color change was observed at a portion of the back face reinforcing metallic member which is some centimeters distant from the edge, where in addition, bulging and layer separation were occurred at the filler.

COMPARATIVE EXAMPLE 3

In this comparative Example, there were prepared two solar cell modules having opposite solar cell-free bent portions.

Each solar cell module was prepared in the following manner.

The procedures of the steps 1 and 2 of Example 1 were repeated, except that the peripheral end portions of the back face reinforcing metallic member was exposed without being covered by the EVA resin layer as in Example 1, to thereby obtain a solar cell module having the same configuration as that shown in FIG. 11.

The resultant solar cell module was subjected to bending treatment by means of the roller forming equipment in the same manner as in Example 5 to obtain a solar cell modules having opposite portions each having been bent at several positions thereof as shown in FIG. 10.

Thus, there were obtained two solar cell modules having the configuration shown in FIG. 10.

For the resultant two solar cell modules, evaluation was conducted by way of the salt spray test and the acid rain cycle test in the same manner as in Example 1.

As a result, in both the salt spray test and the acid rain cycle test, corroded products were generated on all over the cut faces of the back face reinforcing metallic member and the back face reinforcing metallic member was partly rusted. In addition, on the front side of the solar cell module, the occurrence of color changes was observed at edge portions of the back face reinforcing metallic member. Further in addition, bulging and layer separation were occurred at the filler not only in the solar cell-bearing portion but also in the solar cell-free bent portions.

Further, in this comparative example, there was found a further problem. That is, upon the introduction of the solar cell module into the roller forming equipment, layer separation with a relatively large area was occurred at a portion of the solar cell module contacted at a corner of the pressure roller.

As above described, it is understood that the present invention provides such pronounced advantages as will be described below.

By covering the end faces of the back face reinforcing metallic member by a resin, the back face reinforcing metallic member is effectively prevented from being deteriorated or corroded. This situation provides advantages in that the coated film of the back face reinforcing metallic member, which is situated in the vicinity of the end portions of the back face reinforcing metallic member, is prevented from being colored, separated and raised. And by covering a part of the rear face of the back face reinforcing metallic member by an extended portion of said resin, layer separation at the interface between the back face reinforcing member and the filler is effectively prevented.

The above situations provides further advantages as will be described in the following. Not only during the bending treatment of the solar cell module but also during the transportation and installation of the solar cell module, there is not such an occasion that the solar cell modules are not damaged by the edge portions of their back face reinforcing members when they are contacted with each other and therefore, the occurrence of a defective solar cell module is prevented. In the case where the solar cell module is subjected to bending treatment by means of the roller forming equipment, the pressure rollers are prevented from being worn. Further, it is not necessary to use a metallic cover in order to prevent the back face reinforcing metallic member from being separated from the filler, and this situation makes it possible to establish a desirable roof of a simple configuration and having a good exterior appearance when the solar cell module is used as a roof member of a building. In this case, since such metallic cover as above described is not used, there is free of a problem found in the case of using the metallic cover in that dusts or the like are accumulated on the metallic cover. And there can be attained a reduction in the costs required in the roofing by solar cell modules.

Further in addition, the protected solar cell-free end portions of the solar cell module according to the present invention can be bent into a complicate configuration as desired, which is satisfactory in terms of protection.

What is claimed is:

1. A solar cell module comprising a photovoltaic element, a filler for encapsulating said photovoltaic element, and a back face reinforcing metallic member,
    wherein said filler encapsulating said photovoltaic element is situated on a front face of said back face reinforcing metallic member, and
    wherein end faces of said back face reinforcing metallic member and a partial area of a rear face of said back face reinforcing metallic member are covered by a resin.

2. A solar cell module according to claim 1, wherein the back face reinforcing metallic member is applied with plasticity processing.

3. A solar cell module according to claim 1, wherein the back face reinforcing metallic member comprises a steel plate.

4. A solar cell module according to claim 1, wherein the filler comprises a thermoplastic resin.

5. A solar cell module according to claim 1, wherein the resin by which the end faces of the back face reinforcing metallic member and the partial area of the rear face of the back face reinforcing metallic member are covered is a thermoplastic resin.

6. A solar cell module according to claim 5, wherein the thermoplastic resin is the same as the filler.

7. A solar cell module according to claim 1, wherein the photovoltaic element has flexibility.

8. A solar cell module according to claim 1, wherein the photovoltaic element comprises an amorphous silicon material.

9. A solar cell module according to claim 1 which further comprises a surface protective film having a weatherability.

10. A solar cell module according to claim 1, wherein the filler and the resin by which the end faces of the back face reinforcing metallic member and the partial area of the rear face of the back face reinforcing metallic member are covered are the same.

11. A solar cell module according to claim 1, wherein the resin situated on the rear face of the back face reinforcing metallic member is continued from the resin covering the end faces of the back face reinforcing metallic member.

12. A solar cell module according to claim 1, wherein the resin by which the end faces of the back face reinforcing metallic member and the partial area of the rear face of the back face reinforcing metallic member are covered comprises a resin selected from the group consisting of ethylene-vinyl acetate copolymer, ethylene-acrylate copolymer, polyvinyl butyral, silicone resin and acrylic resin.

13. A solar cell module according to claim 1, wherein the filler comprises a resin selected from the group consisting of ethylene-vinyl acetate copolymer, ethylene-acrylate copolymer, polyvinyl butyral, silicone resin and acrylic resin.

14. A solar cell module according to claim 1, wherein the back face reinforcing metallic member is applied with coating treatment.

15. A solar cell module according to claim 1 which further comprises a filler-retaining member.

16. A solar cell module according to claim 15, wherein the filler-retaining member comprises a woven member or a nonwoven member.

17. A process for producing a solar cell module, said process comprising:

(a) a preparation step of stacking a filler material, a photovoltaic element and a back face reinforcing metallic member in the named order to form a stacked body on a mounting table, and arranging a resin material over said stacked body so as to cover peripheries containing end portions of said back face reinforcing metallic member, and (b) a sealing and uniting step of subjecting said stacked body to heat treatment.

18. The process according to claim 17, wherein the sealing and uniting step (b) includes a further step which is conducted prior to subjecting the stacked body to heat treatment, said further step comprising covering the stacked body formed in the preparation step (a) by a covering sheet to hermetically enclose the stacked body between said covering sheet and the mounting table and exhausting the space containing the stacked body between the covering sheet and the mounting table.

19. The process according to claim 17 which further comprises a step of subjecting the stacked body having been subjected to heat treatment in the sealing and uniting step (b) to bending treatment to bend opposite photovoltaic element-free end portions of the stacked body.

20. A process for producing a solar cell module, said process comprising the steps of:

(a) forming a stacked body comprising a filler material, a photovoltaic element and a back face reinforcing metallic member on a mounting table having a protruded portion such that said stacked body is situated on said protruded portion, (b) covering said stacked body by a covering sheet so as to hermetically enclose said stacked body between said covering sheet and said mounting table, and (c) heating and uniting said stacked body while exhausting the space containing said stacked body between said covering sheet and said mounting table.

21. A process for producing a solar cell module, said process comprising the steps of:

(a) forming a stacked body comprising a filler material, a photovoltaic element and a back face reinforcing metallic member on a mounting table having a protruded portion circumscribed by a groove such that said stacked body is situated on said protruded portion, (b) covering said stacked body by a covering sheet so as to hermetically enclose said stacked body between said covering sheet and said mounting table, and (c) heating and uniting said stacked body while exhausting the space containing said stacked body between said covering sheet and said mounting table.

* * * * *

UNITED STATES PATENT AND TRADEMARK OFFICE
CERTIFICATE OF CORRECTION

PATENT NO. : 6,008,450
DATED : December 28, 1999
INVENTOR(S) : TAKASHI OHTSUKA ET AL.

Page 1 of 5

It is certified that error appears in the above-identified patent and that said Letters Patent is hereby corrected as shown below:

COLUMN 1

Line 21, "non-exhaustable" should read --non-exhaustible--;
Line 34, "building" should read --"building--;
Line 35, "module)," should read --module"),--.

COLUMN 2

Line 2, "member" should read --members--;
Line 8, "of a" should read --of an--.

COLUMN 3

Line 12, "other" should read --another--;
Line 16, "an worker" should read --a worker--;
Line 18, "make" should read --makes--;
Line 19, "other" should read --another--;
Line 31, "damage" should read --damages--.

COLUMN 4

Line 31, "rein," should read --resin,--;
Line 42, "provides" should read --provide--.

COLUMN 5

Line 9, "be" should be deleted;
Line 17, "line A-A'" should read --line 2-2--;
Line 21, "a" should read --an--;
Line 41, "line B-B'" should read --line 13-13--.

UNITED STATES PATENT AND TRADEMARK OFFICE
CERTIFICATE OF CORRECTION

PATENT NO.    : 6,008,450
DATED         : December 28, 1999
INVENTOR(S)   : TAKASHI OHTSUKA ET AL.

It is certified that error appears in the above-identified patent and that said Letters Patent is hereby corrected as shown below:

COLUMN 6

Line 7, "line A-A'" should read --line 2-2--;
Line 40, "preferably" should read --preferable--;
Line 55, "an" should read --a--;
Line 63, "conversions" should read --conversion.--.

COLUMN 7

Line 5, "shottky" should read --schottky--.

COLUMN 8

Line 8, "on the side" should be deleted.

COLUMN 9

Line 3, "persentage." should read --percentage.--;
Line 30, "weaterable" should read --weatherable--;
Line 33, "excels" should read --excel--;
Line 55, "weaterable" should read --weatherable--;
Line 66, "the the" should read --the-- and "a" should read
   --an--.

UNITED STATES PATENT AND TRADEMARK OFFICE
CERTIFICATE OF CORRECTION

PATENT NO. : 6,008,450

DATED : December 28, 1999

INVENTOR(S) : TAKASHI OHTSUKA ET AL.

Page 3 of 5

It is certified that error appears in the above-identified patent and that said Letters Patent is hereby corrected as shown below:

COLUMN 10

Line 9, "a" should read --an--;
    Line 11, "constituted" should read --constituted by--;
    Line 20, "constituted" should read --constituted by--;
    Line 25, "being" should read --been--;
    Line 55, "an" should read --a--;
    Line 63, "appropriated location," should read --appropriate locations,--.

COLUMN 11

Line 26, "laminater." should read --laminator.--;
    Line 37, "laminater" should read --laminator--;
    Line 38, "laminater" should read --laminator--;
    Line 66, "as as" should read --as--.

COLUMN 12

Line 56, "(ethylenevinyl" should read --(ethylene-vinyl--.

COLUMN 13

Line 57, "rein" should read --resin--.

UNITED STATES PATENT AND TRADEMARK OFFICE
CERTIFICATE OF CORRECTION

PATENT NO. : 6,008,450
DATED : December 28, 1999
INVENTOR(S) : TAKASHI OHTSUKA ET AL.

It is certified that error appears in the above-identified patent and that said Letters Patent is hereby corrected as shown below:

COLUMN 14

Line 19, "galvernized" should read --galvanized--;
    Line 40, "laminater." should read --laminator.--;
    Line 54, "laminater" should read --laminator--;
    Line 55, "laminater" should read --laminator--.

COLUMN 16

Line 34, "rein" should read --resin--;
    Line 63, "rein" should read --resin--.

COLUMN 17

Line 35, "modules" should read --module--.

COLUMN 18

Line 42, "line B-B'" should read --line 13-13--;
    Line 54, "was" should read --were--;
    Line 61, "module" should read --modules--.

COLUMN 19

Line 28, "was" should read --were--;
    Line 35, "modules" should read --module--.

UNITED STATES PATENT AND TRADEMARK OFFICE
CERTIFICATE OF CORRECTION

PATENT NO. : 6,008,450
DATED : December 28, 1999
INVENTOR(S) : TAKASHI OHTSUKA ET AL.

It is certified that error appears in the above-identified patent and that said Letters Patent is hereby corrected as shown below:

COLUMN 20

Line 7, "provides" should read --provide--;
Line 25, "there" should read --it--.

Signed and Sealed this

Twenty-fourth Day of April, 2001

*Attest:*

NICHOLAS P. GODICI

*Attesting Officer*    Acting Director of the United States Patent and Trademark Office